US009293625B2

(12) United States Patent
Sun et al.

(10) Patent No.: US 9,293,625 B2
(45) Date of Patent: Mar. 22, 2016

(54) METHOD FOR MANUFACTURING A SEMICONDUCTOR DEVICE BASED ON EPITAXIAL GROWTH

(71) Applicant: TANDEM SUN AB, Sollentuna (SE)

(72) Inventors: Yanting Sun, Sollentuna (SE); Sebastian Lourdudoss, Taby (SE)

(73) Assignee: Tandem Sun AB, Sollentuna (SE)

( * ) Notice: Subject to any disclaimer, the term of this patent is extended or adjusted under 35 U.S.C. 154(b) by 0 days.

(21) Appl. No.: 14/390,972

(22) PCT Filed: Mar. 28, 2013

(86) PCT No.: PCT/SE2013/050355
§ 371 (c)(1),
(2) Date: Oct. 6, 2014

(87) PCT Pub. No.: WO2013/154485
PCT Pub. Date: Oct. 17, 2013

(65) Prior Publication Data
US 2015/0063388 A1    Mar. 5, 2015

Related U.S. Application Data

(60) Provisional application No. 61/624,110, filed on Apr. 13, 2012.

(51) Int. Cl.
*H01L 21/20* (2006.01)
*H01L 31/0725* (2012.01)
(Continued)

(52) U.S. Cl.
CPC ........ *H01L 31/0725* (2013.01); *H01L 21/0237* (2013.01); *H01L 21/0265* (2013.01); *H01L 21/02381* (2013.01); *H01L 21/02433* (2013.01); *H01L 21/02461* (2013.01); *H01L 21/02463* (2013.01); *H01L 21/02494* (2013.01); *H01L 21/02502* (2013.01); *H01L 21/02543* (2013.01); *H01L 21/02546* (2013.01); *H01L 21/02609* (2013.01); *H01L 21/02639* (2013.01); *H01L 31/02168* (2013.01); *H01L 31/022425* (2013.01); *H01L 31/0304* (2013.01); *H01L 31/036* (2013.01); *H01L 31/03046* (2013.01); *H01L 31/06875* (2013.01); *H01L 31/0735* (2013.01); *H01L 31/107* (2013.01); *H01L31/184* (2013.01); *H01L 31/1844* (2013.01); *H01L 31/1852* (2013.01); *H01S 5/32308* (2013.01); *Y02E 10/544* (2013.01); *Y02P 70/521* (2015.11)
(Continued)

(58) Field of Classification Search
CPC ................................................. H01L 21/02647
USPC .......................................................... 438/481
See application file for complete search history.

(56) References Cited

U.S. PATENT DOCUMENTS 8,242,003 B1 * 8/2012 Han ................... H01L 21/02381
257/E21.335
2001/0009167 A1    7/2001 Davis et al.
(Continued)

FOREIGN PATENT DOCUMENTS

EP    1005067 A2    5/2000
EP    1280190 A1    1/2003
(Continued)

*Primary Examiner* — Mark Prenty
(74) *Attorney, Agent, or Firm* — Gable Gotwals

(57) ABSTRACT

This invention relates to a method for manufacturing a semiconductor device and semiconductor manufactured thereby, including growing, from a seed island mesa, an abrupt heterojunction comprising a semiconductor crystal with few crystal defects on a dissimilar substrate that can be used as light emitting and photovoltaic device.

9 Claims, 16 Drawing Sheets

(51) Int. Cl.
  *H01L 21/02*     (2006.01)
  *H01L 31/0687*   (2012.01)
  *H01L 31/107*    (2006.01)
  *H01L 31/18*     (2006.01)
  *H01L 31/0216*   (2014.01)
  *H01L 31/0224*   (2006.01)
  *H01L 31/0304*   (2006.01)
  *H01L 31/036*    (2006.01)
  *H01L 31/0735*   (2012.01)
  *H01S 5/323*     (2006.01)

(56) References Cited

U.S. PATENT DOCUMENTS

2002/0022290 A1   2/2002   Kong et al.
2003/0139037 A1   7/2003   Kobayashi et al.

FOREIGN PATENT DOCUMENTS

JP   2001093837 A    4/2001
WO   2008115135 A1   9/2008

\* cited by examiner

METHOD FOR MANUFACTURING A SEMICONDUCTOR DEVICE BASED ON EPITAXIAL GROWTH

CROSS-REFERENCE TO RELATED APPLICATIONS

This application is the United States National Phase of PCT Patent Application No. PCT/SE2013/050355 filed on 28 Mar. 2013, which claims priority to U.S. Provisional Patent Application No. 61/624,110 filed 13 Apr. 2012, both of which are incorporated herein by reference.

FIELD OF THE INVENTION

The present invention relates to semiconductor devices and manufacturing thereof, in particular the present invention relates to a method for manufacturing a semiconductor device having a hetero structure. The present invention also relates to semiconductor devices manufactured by means of the method.

BACKGROUND

Semiconductor devices can be manufactured for instance by means of so-called "wafer bonding". Wafer bonding is a packaging technology on wafer-level suitable for the fabrication of for instance micro-electromechanical systems (MEMS), nano-electromechanical systems (NEMS), microelectronics and optoelectronics. Typically, wafer bonding ensures a mechanically stable and hermetically sealed encapsulation. Typically, wafers manufactured, comprising semiconductors, can have a diameter ranging from 100 mm to 200 mm (from 4 inch to 8 inch) for MEMS/NEMS and up to 300 mm (12 inch) for the production of semiconductor devices such as microelectronics and optoelectronics.

Unfortunately, for some applications, the cost of a semiconductor device made by wafer bonding will be high and the yield of the method for manufacturing the device will be low because of limited available wafer size of bonded semiconductors on a substrate, such as a dissimilar substrate. Wafer bonding is also limited to available effective wafer size of the substrate, which is typically much smaller than the regular size of the dissimilar substrate. Conformability between semiconductor material and dissimilar substrate can also be questioned and may in worst case lead to material bonding problems. Failure of bonding between two materials during operation of a semiconductor device could be catastrophic.

Also, other techniques have found application for manufacturing semiconductor devices, such as techniques using epitaxial technology, and in particular "selective epitaxial growth". This is described for instance in "Multiple Layers of Silicon-on-Insulator Islands Fabrication by Selective Epitaxial Growth, S. Pae, et. al. IEEE ELECTRON DEVICE LETTERS, VOL. 20, NO. 5, MAY 1999", IEEE.

SUMMARY OF THE INVENTION

According to an aspect of the present invention, there is provided a method for manufacturing a semiconductor device based on epitaxial growth. The size of a semiconductor device that can be manufactured using the method according to the invention will only be determined by the available wafer size of the dissimilar substrate, which typically can be as large as 12 inch for a silicon (Si) substrate. Moreover, conformability between the semiconductor material and the dissimilar substrate is superior to prior art methods due to the inherent characteristic of epitaxial growth.

Herein, the term "semiconductor device" includes any semiconductor device precursor, such as a semiconductor substrate, up to and including a semiconductor device such as a semiconductor laser ready for use.

Herein, the term "dissimilar" means that the grown semiconductor and the substrate are made of different materials.

According to an embodiment of the present invention, there is provided a method for manufacturing a semiconductor device, such as a semiconductor substrate. The method comprises the steps of: forming a buffer layer and a seed layer on a dissimilar semiconductor substrate on a front side thereof, followed by processing to provide one or more seed island mesas, typically having a particular orientation on the dissimilar semiconductor substrate. An insulating mask layer is then formed on the at least one seed island mesa. The insulating mask layer has an opening provided on the seed island mesa. If not, an opening is created in the insulating mask layer. Then a semiconductor growth layer having consecutive semiconductor regions grown onto each other is grown from the opening of the insulating mask layer. The growth is selective: epitaxially, vertically and laterally, wherein a first region having high defect density is only grown vertically from the opening, while the other regions are grown until at least one semiconductor region having low defect density coalesces with the front side of the semiconductor substrate. The first region and a second region of the semiconductor growth layer with high defect density can be removed by etching and a third region with low defect density is not etched, typically protected from etching to prepare a semiconductor layer for semiconductor device fabrication.

In this way, a semiconductor device having a hetero-structure, for instance a semiconductor substrate, with low defect density can be manufactured on a dissimilar substrate.

In general, a mesa is an elevated area of land with a flat top, surrounded on all sides by steep cliffs. Herein, the term "mesa" means an area on a semiconductor substrate where a semiconductor has not been etched away. Typically, a mesa rises above a surrounding semiconductor substrate, and the height of the elevated area is typically a few microns.

In this way, there is provided a method for processing a dissimilar substrate wherein seed island mesas of a semiconductor material is covered by a insulating mask layer, typically an insulating mask over an exposed surface of the seed island mesa. Openings are created in the insulating mask layer. An overgrowth crystalline layer of a semiconductor material is grown, filling the openings, covering the mask on the seed island mesas and then growing both laterally and downward to cover the exposed surface of the dissimilar substrate surrounding of seed island. The region(s) with high defect density in the grown semiconductor layer is/are typically removed by etching and the region(s) with low defect density is/are left behind from etching, or in other words, they are not etched, and semiconductor devices including templates of semiconductor material with low defect density are manufactured on the dissimilar substrate.

Herein, the term "template" means any kind of semiconductor precursor having a semiconductor layer prepared for manufacturing a semiconductor device such as a semiconductor laser diode device.

According to another embodiment of the present invention, there is provided a method for manufacturing a semiconductor device, wherein an insulating mask layer is formed thereon, and an opening is created in the insulating mask layer, herein on top of the mesa islands. Then a semiconductor growth layer having consecutive semiconductor regions grown onto each other is grown from the opening of the insulating mask layer, epitaxially, vertically and laterally, wherein a first region having high defect density is only grown vertically from the opening, while the other regions are grown until at least one semiconductor region having low defect density coalesces with the insulating mask layer 72.

Typically, the process steps up to seed island mesa formation, buffer layer, seed layer and seed island mesa formation are the same for the various embodiments of the methods according to the invention.

According to another embodiment of the present invention, there is provided a semiconductor device manufactured by the method disclosed above.

According to another aspect of the present invention, a semiconductor hetero-structure having low defect density comprises a semiconductor layer on a dissimilar substrate manufactured by the method disclosed above. This substrate can be a semiconductor with indirect band-gap. The semiconductor layer can have direct band-gap. Both a conduction and valence band edge energy of the dissimilar substrate semiconductor material is higher than that of the semiconductor layer. The constituent semiconductor materials form a type-II hetero-junction where the electrons are confined on the side of the semiconductor layer with direct band-gap and the holes are confined on the side of the dissimilar substrate with indirect band-gap. The electron and holes recombine radiatively at the interface of hetero-junction due to tunneling effect and light with energy lower than the band-gap of both heterojunction constituent materials can be emitted. This type-II hetero-junction can be used to absorb photons with energy lower than the band-gap of constituent semiconductors. Electrons in a valence band of the indirect semiconductor are excited to conduction band of direct semiconductor.

Herein the term "hetero-junction" means the interface that occurs between two layers or regions of dissimilar crystalline semiconductors. These semiconducting materials have unequal band gaps. The combination of multiple hetero-junctions together in a device is called a "hetero-structure" although the two terms are commonly used interchangeably. Herein, both terms apply to the invention without reducing the scope of protection. Herein, another definition of the term "hetero-junction" is the interface between any two solid-state materials, including crystalline and amorphous structures of metallic, insulating, fast ion conducting and semiconducting materials.

According to another aspect of the present invention, there is provided a multi-junction solar cell comprising a silicon sub-cell and sub-cells of semiconductors with band-gap matching to solar spectrum, for example GaAs, GaInP, GaP, and Si sub-cells. The sub-cells are electrically serially connected and two electrodes are used to connect the multi-junction solar cell to a load. The Si sub-cell is fabricated into the Si substrate. On top of the Si substrate with the Si sub-cell, semiconductor templates are grown by the invented method. The sub-cells, which are made of semiconductors with suitable band-gaps, are grown on the semiconductor templates on Si. In order to increase efficiency even further, more sub-cells having different band-gaps can be provided.

According to another aspect of the present invention, there is provided a multi-junction solar cell comprising a silicon sub-cell and sub-cells of semiconductors with band-gap matching to solar spectrum, for example GaAs, GaInP, GaP and Si sub-cells. The Si sub-cell and other sub-cells are electrically isolated and are connected to load with separated electrode pairs. The Si sub-cell is fabricated into the Si substrate. On top of the Si substrate with Si sub-cell heterostructure of semiconductors are grown by the invented method. The sub-cells made of semiconductors with suitable band-gap are grown on the semiconductor hetero-structure on Si.

Embodiments of the present invention will now be described in more detail with reference to the accompanying drawing figures, of which:

BRIEF DESCRIPTION OF DRAWINGS

FIG. 1b is view from above of the semiconductor substrate illustrated in FIG. 1a;

DETAILED DESCRIPTION OF THE INVENTION

Figure 1A:
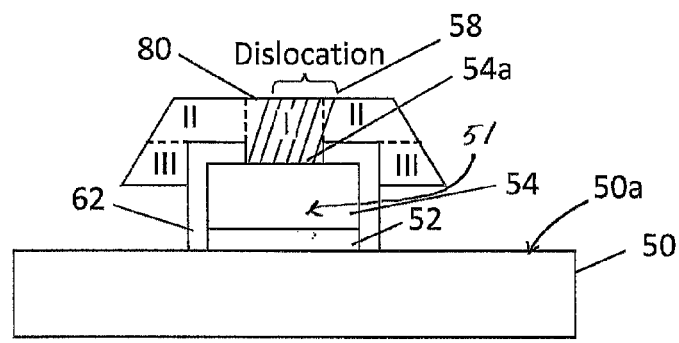
FIG. 1a is a schematic sectional view of a semiconductor substrate being processed for illustrating a method according to an embodiment of the present invention for manufacturing a semiconductor device.

The present invention will be described below with reference to the accompanying drawings. The same or similar parts are mainly denoted by the same reference numerals throughout the drawings.

Figure 9:
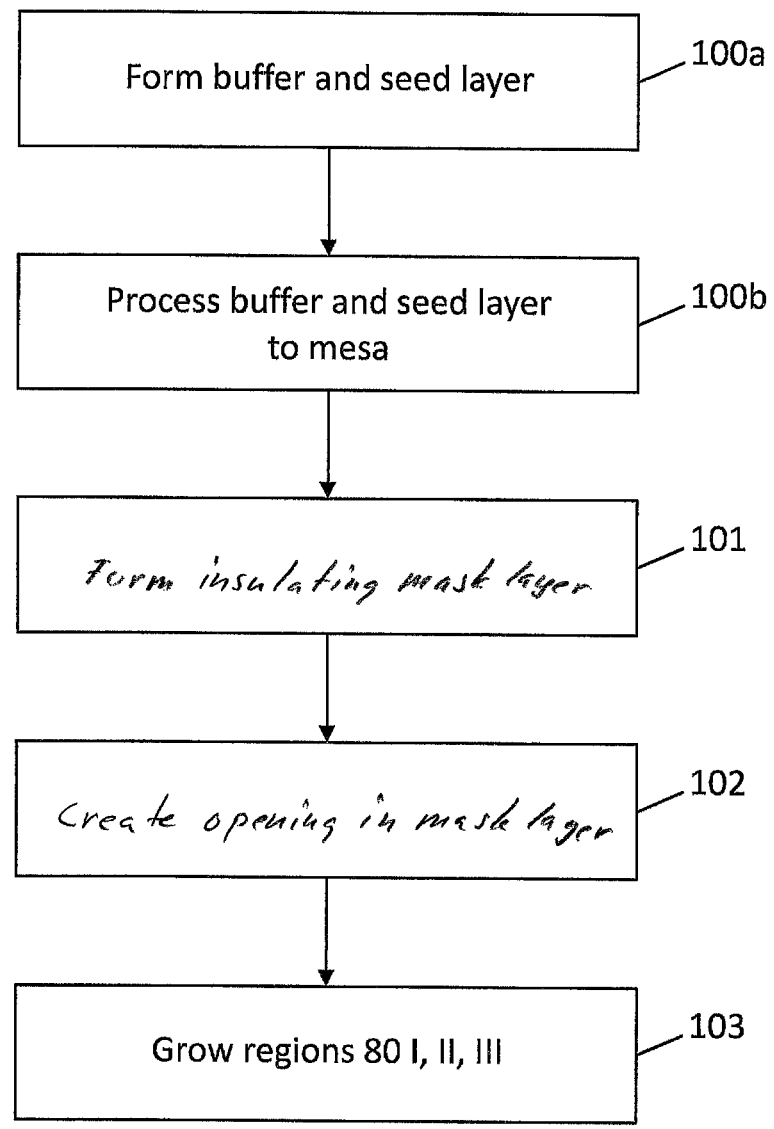
FIG. 9 illustrates a flow chart of the method according to the embodiment illustrated in FIGS. 1a-b and 2a-j.

FIG. 1a illustrates a schematic sectional view of a semiconductor device, herein a substrate, being manufactured by means of the method according to an embodiment of the present invention. Herein, it is also referred to FIG. 9 illustrating the method step by step in a flow chart. First of all, a dissimilar substrate 50 made of for example Si is provided (not illustrated in FIG. 9). A buffer layer 52 made of, for example, GaAs is formed, 100a, for instance grown at low temperature by Molecular Beam Epitaxy (MBE) or MOVPE, on a front side 50a of the substrate 50. Herein, the term "MOVPE" is an acronym for Metal Organic Vapor Phase Epitaxy (MOVPE), also known as Organometallic Vapour Phase Epitaxy or Metal Organic Chemical Vapor Deposition (MOCVD). Then on top of the buffer layer 52, a seed layer 54 made of, for example, InP is formed, 100*a*, for instance grown by MOVPE. The buffer layer 52 can have a thickness of 100 nm or more and the seed layer 54 can have thickness of 1 μm or more. Because of a large lattice mismatch between Si and InP, the seed layer 54 can have high defect density, including defects such as threading dislocation, and stacking faults. The seed layer 54 and buffer layer 52 are processed, 100*b*, to one or more seed island mesa(s) 51, of which only one mesa 51 is illustrated, by conventional photolithography and etching. Then, an insulating mask layer 62, such as a selective growth mask layer, made of, for example, a layer of $SiO_2$ having a thickness of 300 Å or more is formed, 101, for instance deposited by PECVD (Plasma-enhanced chemical vapor deposition). The insulating mask layer 62, is processed to cover a top surface (explained in more detail with reference to FIG. 2*b*) and sidewalls (explained in more detail with reference to FIG. 2*b*) of the mesa 51, wherein a surface portion 50*a* of the substrate 50 not covered by the mesa(s) 51 or the insulating mask layer 62 is exposed. Then, an opening 58 is created, 102, in the insulating mask layer 62 and the surface portion 54*a* of the seed layer 54 is exposed in the opening 58. Then, a semiconductor growth layer 80 made of, for example InP, is grown, 103, from the opening 58, from the exposed surface portion 54*a* of the seed layer 54 on the mesa 51 for instance by using gaseous group III and V element sources. The semiconductor growth layer 80 first grows vertically to form a first semiconductor region 80I. Dislocations in the seed layer 54 will grow into the first semiconductor region 80I and extend to an outer surface of growth of the grown semiconductor growth layer 80. When the grown semiconductor growth layer 80 becomes thicker than the thickness of the insulating mask layer 62, the growth will extend laterally over the insulating mask layer 62 and form a second semiconductor region 80II. A defect density in the second semiconductor region 80II is lower than a defect density in the seed layer 54. Especially, a third semiconductor region 80III of the semiconductor growth layer 80 adjacent to the insulating mask layer 62 has much higher crystal quality than in the first growth region 80I close to the surface portion 54*a* of the seed layer 54 in the second growth region 80II. This is indicated by the whole first semiconductor region (80I, and part of the second region 80II, but not the third region 80III being oblique stroked and labeled "dislocation" intended to illustrate that dislocations are not present in the third semiconductor region 80III, but only in the first and second semiconductor regions 80I and 80II. When the semiconductor growth layer 80 continues to grow laterally and exceeds an edge of the mesa 51 covered by the insulating mask layer 62, the semiconductor layer 80 will grow both laterally and vertically, and toward the front side 50*a* of the substrate 50, which will form the third semiconductor region 80III of the semiconductor growth layer 80. The growth in the third semiconductor region 80III can be viewed as seeded from the semiconductor growth layer 80 adjacent to the insulating mask layer 62 in the second growth region 80II, which has high crystal quality. In addition the growth direction of the semiconductor growth layer 80 in the third growth region 80III is opposite to the direction of threading dislocation originated from the seed layer 54. The growth of the semiconductor growth layer 80 in the third semiconductor region 80III will therefore have very low defect density. When the growth of the semiconductor growth layer 80 continues, contact between the semiconductor growth layer 80 and the substrate 50 is created in a semiconductor layer 81 adjacent to the mesa 51 and the growth of the semiconductor growth layer 80 will extend laterally over the substrate 50. This will be described and illustrated in more detail as follows.

Typically, a plurality of contacts will be provided of a plurality of mesas. Since the semiconductor growth layer 80 is not deposited on the substrate 50 directly but rather by a homo-epitaxial mechanism, no dislocations, such as misfit dislocations and associated threading dislocations will be created at the interface 50*a* between the substrate 50 and the third semiconductor region 80III in the semiconductor growth layer 80.

In FIGS. 1 to 6, only one of a plurality of mesas 51 is illustrated as an example, but the invention is by no means limited to only one mesa 51.

The dissimilar substrate 50 is not specifically limited to the example described above as long as it is made of a material different from the grown semiconductor growth layer 80. For example, a substrate 50 made of Si can be used for the growth of III-V semiconductors; an insulating substrate like a sapphire substrate having a C plane ((0001) plane), an R plane ((1$\bar{1}$02) plane), or an A plane ((11$\bar{2}$0) plane) as a major surface or spinnel ($MgAl_2O_4$), and SiC (including 6H, 4H, and 3C), a ZnS substrate, a GaAs substrate, or a Si substrate can be used for the growth of nitride semiconductors.

Figure 1B:
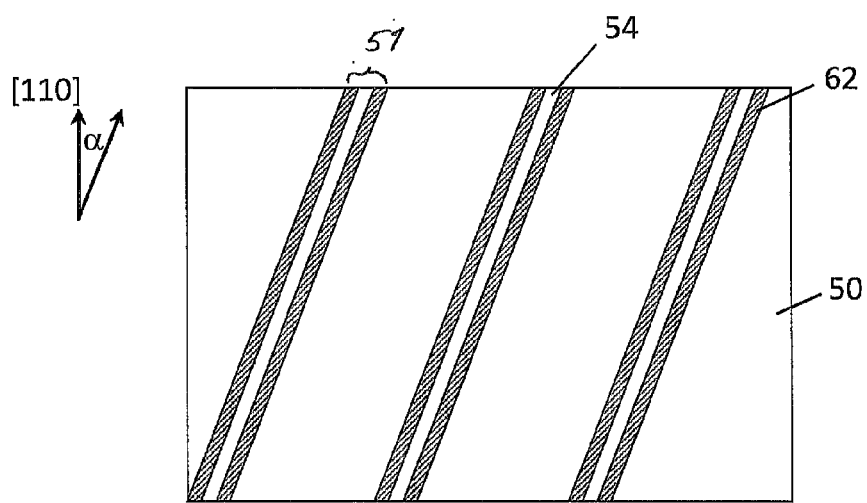

As seen in a left inset of FIG. 1*b*, in order to have a high aspect ratio between vertical growth rate and lateral growth rate for the semiconductor growth layer 80, the orientation angle α of the mesa 51 of the seed layer 54 and the buffer layer 52 has to be selected carefully according to an embodiment of the present invention to a particular orientation angle α.

For example, for the growth of a $Ga_xIn_{1-x}As_yP_{1-y}$ ($0<x<1$; $0<y<1$) on a (001) Si substrate, the mesas 51 have to be oriented along an orientation angle α from a crystal direction <110>. According to an embodiment, the orientation angle α can be between 0 to ±45 degrees. Typically, the orientation angle α is selected according to a crystalline plane of the substrate and growth parameters, such as temperature, dopant, pressure, etc. According to an embodiment of the present invention, the openings 58 in the insulating mask layer 62 on top 60 of the seed island mesas 51 are oriented at the same direction as the mesas 51.

Figure 2A:
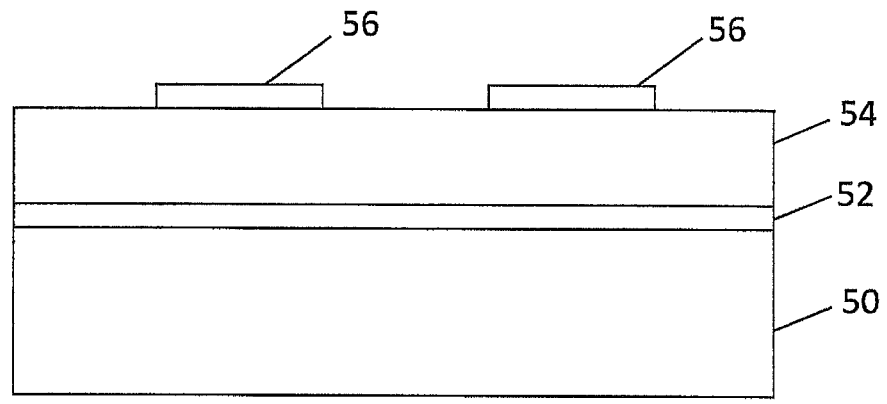
FIGS. 2a to 2j are schematic sectional views of the semiconductor substrate illustrated in FIG. 1a-b for illustrating a method according to an embodiment of the present invention.

FIGS. 2*a* to 2*g* are sectional views for further explaining the principle of a method for manufacturing a semiconductor according to an embodiment of the present invention essentially step by step, wherein a few steps are illustrated in combination. In FIGS. 2*a* to 2*g*, the process flow how to manufacture a hetero-structure comprising a semiconductor substrate 50 and lattice mismatched grown semiconductor layer with very low defect density is illustrated. As seen in FIG. 2*a*, buffer layer 52 made of, for example GaAs, is formed, 100*a*, for instance grown, or has been grown, on the substrate 50, such as a (001) Si substrate by MOPVE at low temperature. The seed layer 54 made of, for example InP is, or has been, continuously grown by MOVPE and can have a thickness of approximately 2 μm. A protective mesa mask 56 made of, for example $SiO_2$ or $SiN_x$ is, or has been, deposited by PECVD and patterned to a plurality of stripes by photolithography. Typically, the protective mesa mask 56 can have thickness of more than 300 Å and a width corresponding to a desired mesa width.

Figure 2B:
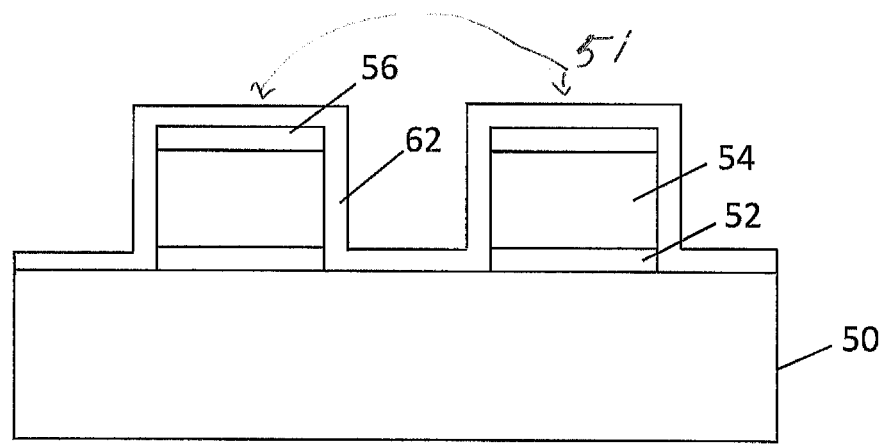

As illustrated in FIG. 2*b*, the seed layer 54 and the buffer layer 52 are, or have been, processed, 100*b*, to a plurality of, herein two, mesas 51 typically by dry etching. A insulating mask layer 62 made of, for example $Si_3N_4$, has been formed over the substrate 50 and the protective mesa mask 56, and is typically deposited by PECVD. The insulating mask layer 62 can have a thickness of more than 300 Å.

Figure 2C:
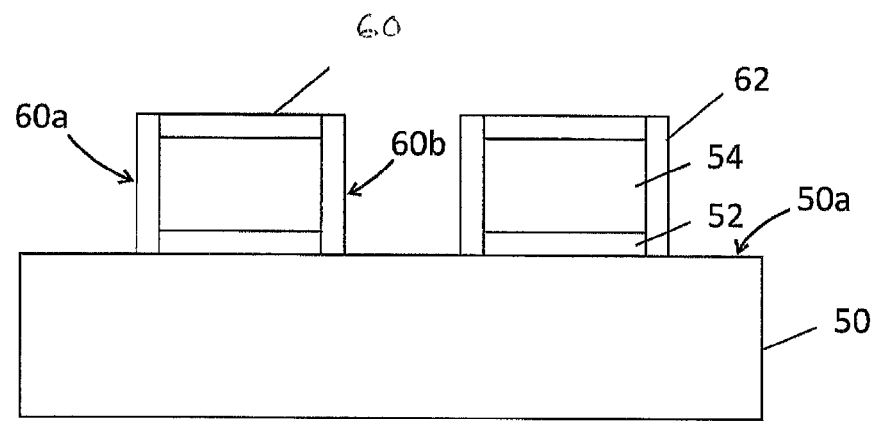

As illustrated in FIG. 2c, the insulating mask layer 62 is, or has been, etched by $SF_6$ and $CH_4$ in a reactive ion etching reactor. Chemical $CHF_3$ can also be used to etch the insulating mask layer 62 in the reactive ion etching reactor. The insulating mask layer 62 is etched away completely from a top surface 60 of the mesas 51 and the substrate 50, whereas the insulating mask layer 62 on the side walls 60a, b of the mesas 51 is protected, for instance by polymers formed during etching and is intact after etching. Thus, the top surface 60 of the mesa 51 and the front side 50a of the substrate 50 can be exposed. The front side 50a of the substrate 50 can be exposed by processes such as photolithography with photoresist reflow and chemical or dry etching of the insulating mask layer 62.

Figure 2D:
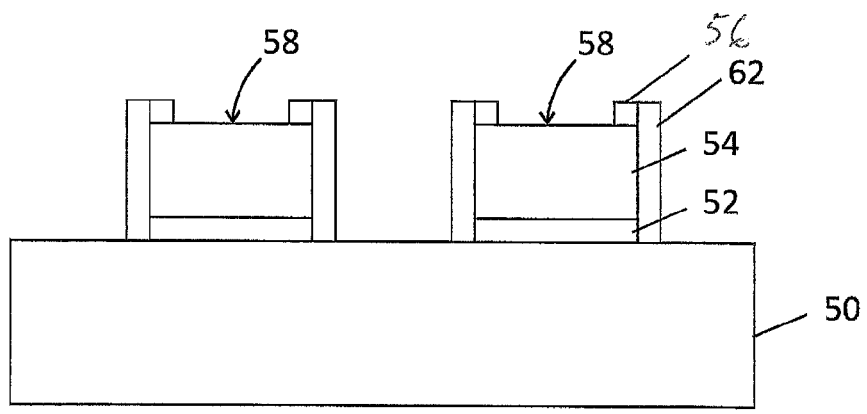
Figure 2E:
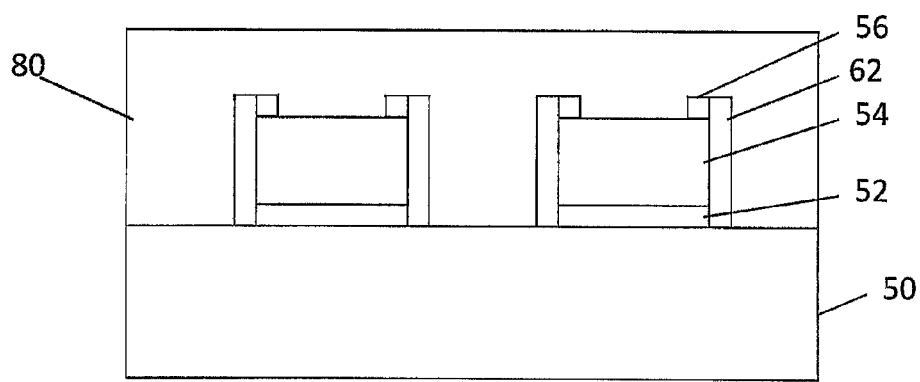

As illustrated in FIG. 2d, a plurality of openings 58 are, or have been, created, 102, by photolithography and etched in the insulating mask layer 62. As illustrated in FIG. 2e, epitaxial growth of the semiconductor growth layer 80 made of, for example InP is carried out, 103, in Hydride Vapor Phase Epitaxy (HVPE). The front side 50a of the substrate 50 made of, for example Si is cleaned properly before the substrate 50 being brought to an HVPE growth chamber. A solution of $H_2SO_4:H_2:O_2$ and $NH_4OH:H_2O_2$ is used to remove the organic impurities and particles. Following a wet chemical ex-situ cleaning process, the substrate 50 made of Si is dipped in a solution of $1HF:10H_2O$ for 10 seconds to remove oxide. As an example, the growth temperature in the HVPE growth chamber is 620° C. and the pressure is 20 mBar. With sufficient growth time, which is obvious to the skilled person, the selective growths from adjacent mesas 51 will result in wide third semiconductor regions 80III, which will coalesce to form a continuous grown semiconductor layer 81 on the front side 50a of the substrate 50.

Figure 2F:
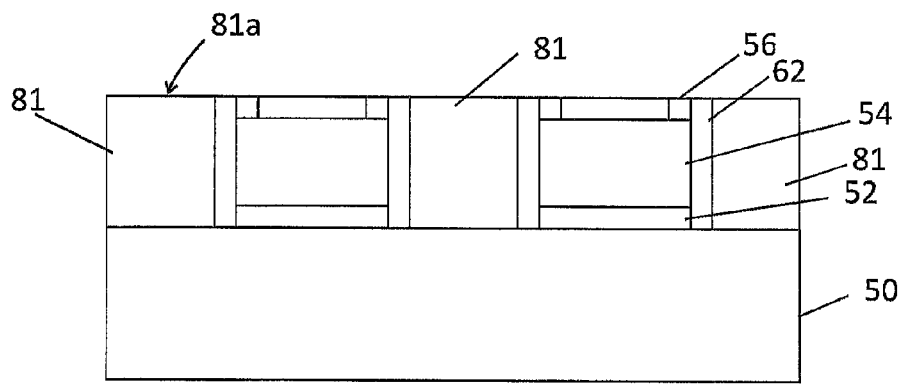

As illustrated in FIG. 2f, the vertical and lateral growth portion of the semiconductor growth layer 80 is etched away by for example, chemical mechanical etching. The etching process is stopped at the top surface 60 of the growth layer. A surface 81a of the grown semiconductor layer 81, which is the vertical growth of the third semiconductor region 80III of the semiconductor growth layer 80, is further polished to an epi-ready surface, by means of a polishing method, known to the skilled person per se, which polishing method provides low metal contamination from the polishing and a surface roughness of 2-3 Å. Herein, epi-ready means that the carbon and native oxide layers on the epi-ready surface can be removed by in situ cleaning in an MOVPE reactor.

Figure 2G:
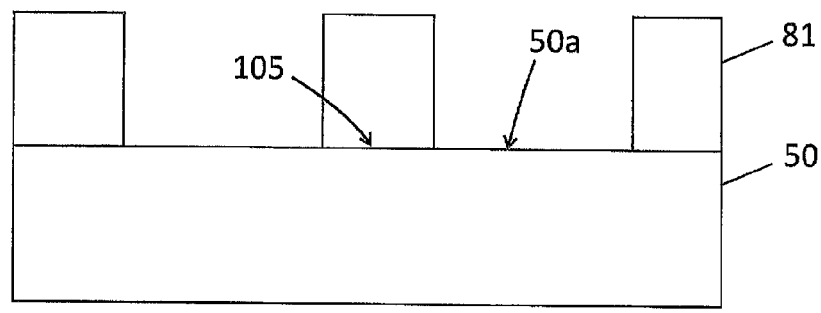

As seen in FIG. 2g, according to an embodiment of the present invention, the mesa 51 of the seed layer 54 and buffer layer 52 and insulating mask layer 62 are, or have been, etched away by chemical etching after the grown semiconductor layer 81 has been protected by a photo-resist. The grown semiconductor layer 81 has very low defect density and an abrupt hetero-junction 105 is formed between the semiconductor layer 81 and the front side 50a of the substrate 50. This hetero-junction 105 can be used in a semiconductor device as an active structure, for example as a light emission region in a laser diode or a light emitting diode and absorption region for photons with energy lower than the constituent semiconductors in a light sensitive semiconductor device such as a photodiode, solar cell, or photo-detector. This hetero-junction 105 can alternatively be used to manufacture an avalanche photodiode where the grown semiconductor layer 81 is configured for light absorption and the dissimilar substrate 50 is used for electron impact ionization. The grown semiconductor layer 81 can also be used as a substrate for manufacturing semiconductor device fabrication, for example laser diode, photodiode, high speed field effect transistor (FET) made of III-V semiconductor on silicon substrate 50. Other examples are high power electronic devices having wide band-gap GaN materials on silicon for electronics.

Figure 2H:
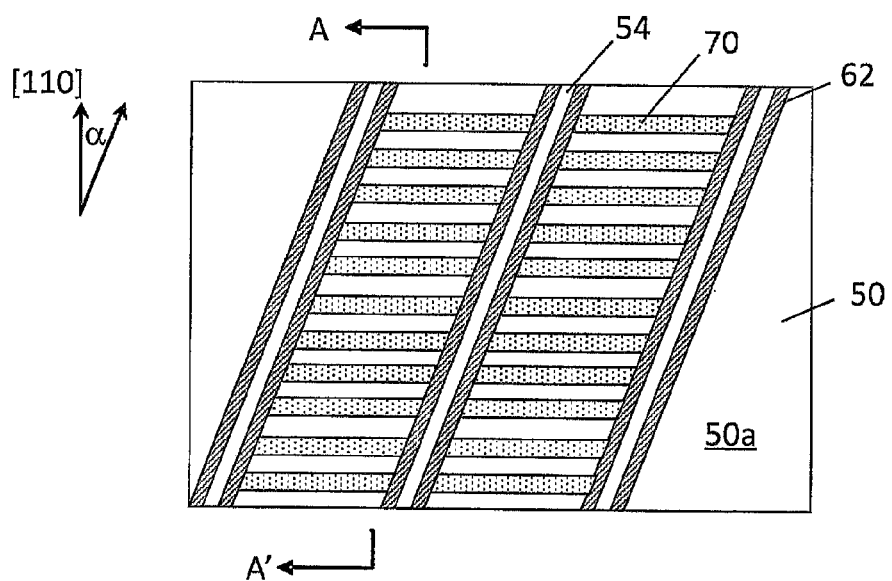
Figure 2I:
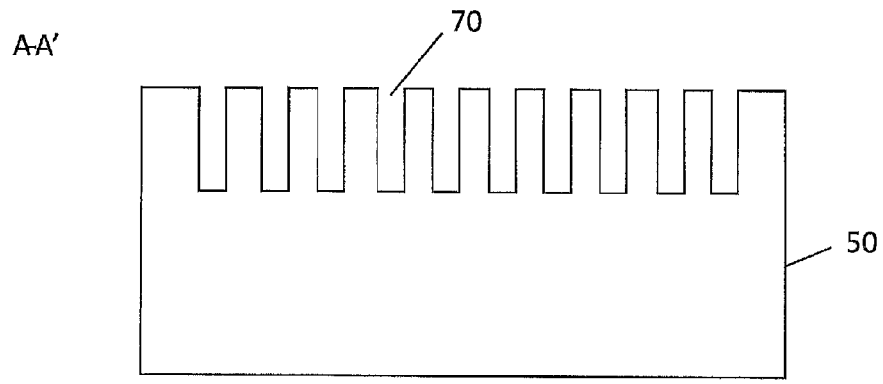
Figure 2J:
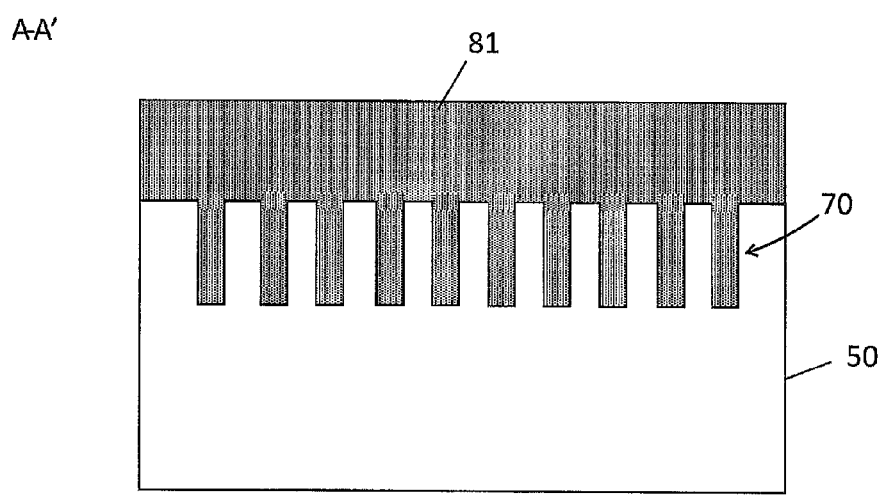

FIGS. 2h to 2j are sectional views intended to explain the application of the method for manufacturing a semiconductor according to an embodiment of the invention on a corrugated dissimilar substrate surface 50. As illustrated in FIG. 2h, a plurality of corrugations 70 are created on the front side 50a of the dissimilar substrate 50 before the grown semiconductor layer 81 is fabricated. The corrugations 70 can have any kinds of shape, dimension, and depth. The corrugations 70 can be repeated in any kinds of manner on the front side 50a of the dissimilar substrate. FIG. 2i illustrates a cross section along a line A-A' of the dissimilar substrate having the corrugations 70 providing a corrugated surface. The method steps for manufacturing the semiconductor layer 81 that is explained in FIGS. 2e to 2g can be carried out also on a corrugated surface of the dissimilar substrate 50. The grown semiconductor layer 81 will then fill up the corrugations 70 on the dissimilar substrate 50 as illustrated in FIG. 2j.

Figure 10:
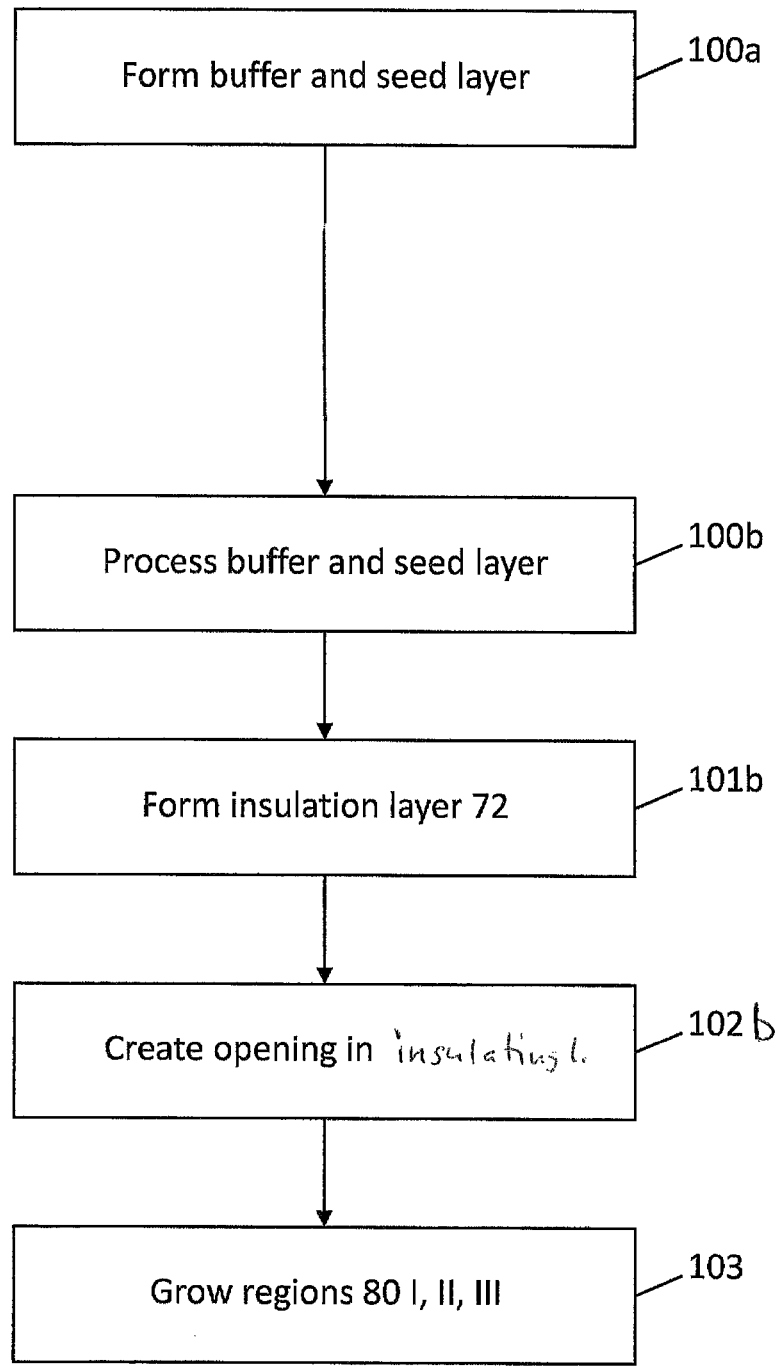
FIG. 10 illustrates a flow chart of the method according to the embodiment illustrated in FIG. 3a-f.

FIGS. 3a to 3f are sectional views for explaining an alternative method for manufacturing a semiconductor device according to another embodiment of the present invention. Herein, it is also referred to FIG. 10 which is a flow-chart illustrating the method steps. The process flow to manufacture a hetero-structure comprising a dissimilar substrate 50, an insulating mask layer 72 and a grown semiconductor layer 91 with low defect density is illustrated.

Figure 3A:
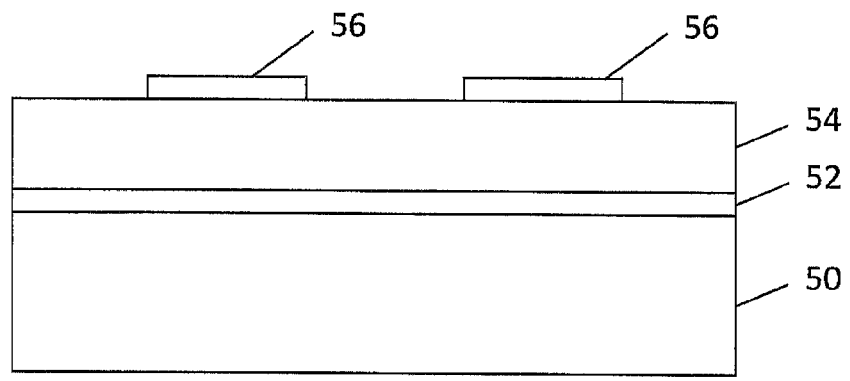
FIGS. 3a to 3f are schematic sectional views of a semiconductor substrate for illustrating a method according to another embodiment of the present invention for manufacturing a semiconductor device.

As shown in FIG. 3a, buffer layer 52 made of, for example GaAs, is grown, 100a, on a substrate 50, such as a (001) Si substrate by MOPVE at low temperature. The seed layer 54 made of, for example InP is continuously grown by MOVPE and can have a thickness of approximately 2 µm. A protective mesa mask 56 made of, for example $SiO_2$ is deposited, 101, by PECVD and patterned to stripes, of which two are illustrated, by photolithography. The mesa mask 56 can have thickness of more than 300 Å.

Figure 3B:
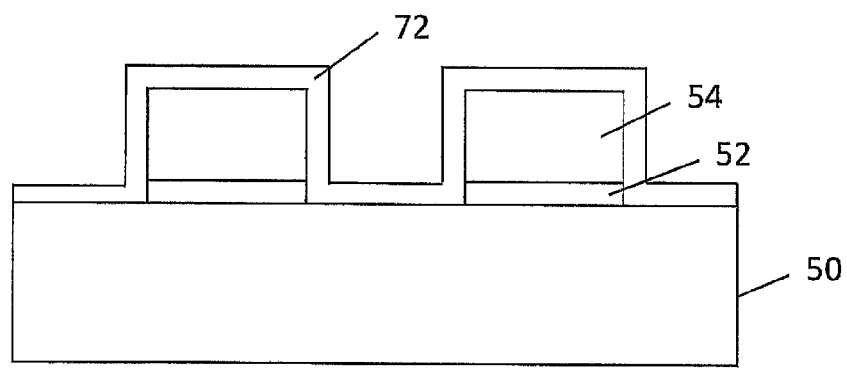
Figure 3C:
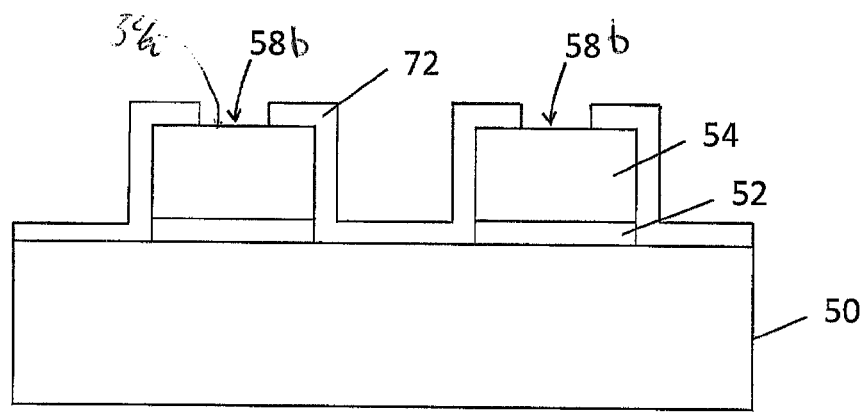

As shown in FIG. 3b, after the buffer layer 52 and seed layer 54 are processed, 100b, to a mesa 51 by a photolithography and etching process, for example, reactive ion etching, an insulating mask layer, or isolator 72, for example $Si_3N_4$ is deposited, 101b, on the whole substrate 50 by PECVD. As shown in FIG. 3c, openings 58b are created, 102, in the insulating mask layer 72 on top of the buffer and seed layer 52, 54 to expose a surface region 54a of the seed layer 54.

Figure 3D:
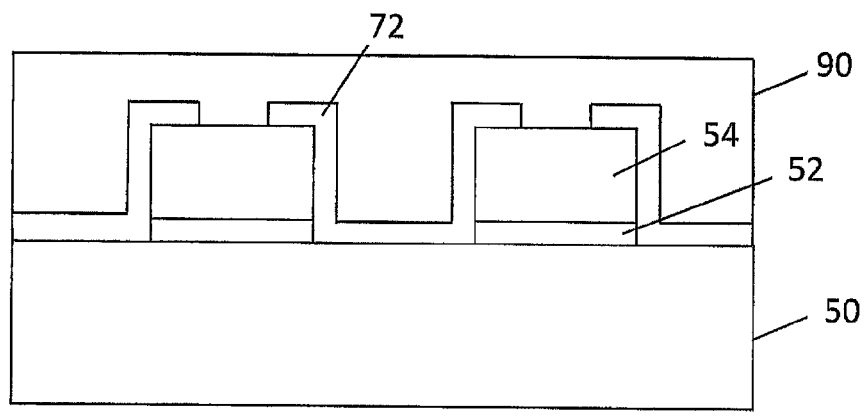

As shown in FIG. 3d, a semiconductor layer 90 made of, for example InP, is grown, 103, by hydride vapor phase epitaxy (HVPE). After sufficient growth time, the selective growth from adjacent mesas 51 will combine to form a uniform grown semiconductor layer 90.

Figure 3E:
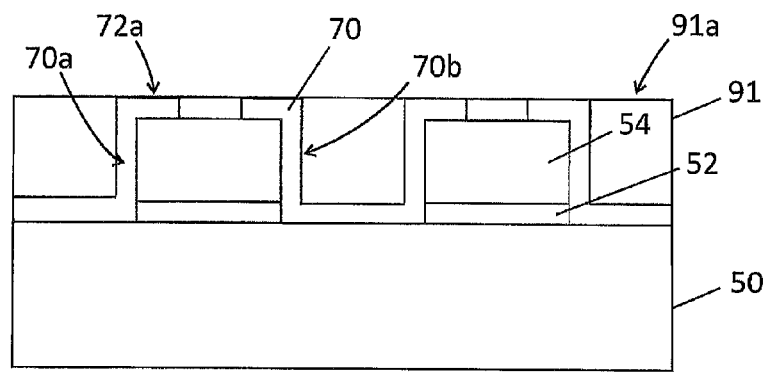

As seen in FIG. 3e, the vertical and lateral growth portions of the semiconductor layer 90 are etched by, for example chemical mechanical etching. The etching stopped at the surface 72a of the insulating mask layer 72. The surface 91a of the grown semiconductor layer 91 is polished to be epi-ready.

Figure 3F:
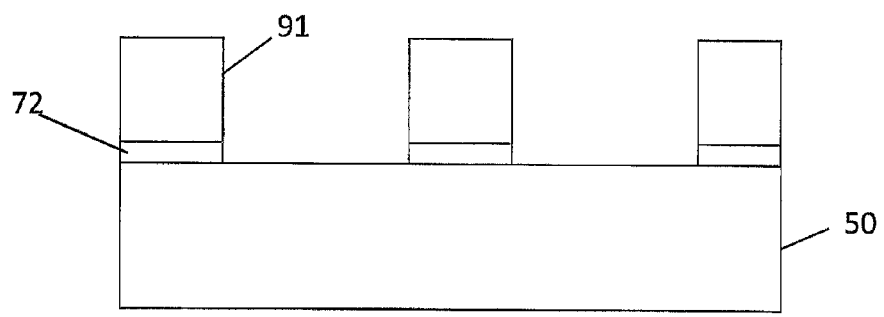

As seen in FIG. 3f, the mesa 51 of the seed layer 54 and the buffer layer 52 and the side walls 70a, b of the insulating mask layer 72 are etched away after the grown semiconductor layer 91 is, or has been, protected by photo-resist and processed by photolithography. A hetero-structure comprising a dissimilar substrate 50, an insulating mask layer 72 and a grown semiconductor layer 91 with very low defect density is manufactured.

As is obvious from the above description, the grown semiconductor layers 91, grown by the method of the present invention have very few defects, and can effectively be used as semiconductor devices, such as substrates for supporting a predetermined semiconductor device thereon, providing a "semiconductor on insulator structure". For instance, the "semiconductor on insulator structure" has the advantage of low parasitic capacitance, which provides a superior structure for high speed electronic devices compared to prior art structures.

The predetermined semiconductor device to be supported on the semiconductor structures of the present invention is not specifically limited as long as it has a predetermined device function, typically a hetero-junction, and includes a laser diode device structure, a multi-junction solar cell device, and the like. However, the devices are not limited to any of these examples mentioned.

Figure 4:
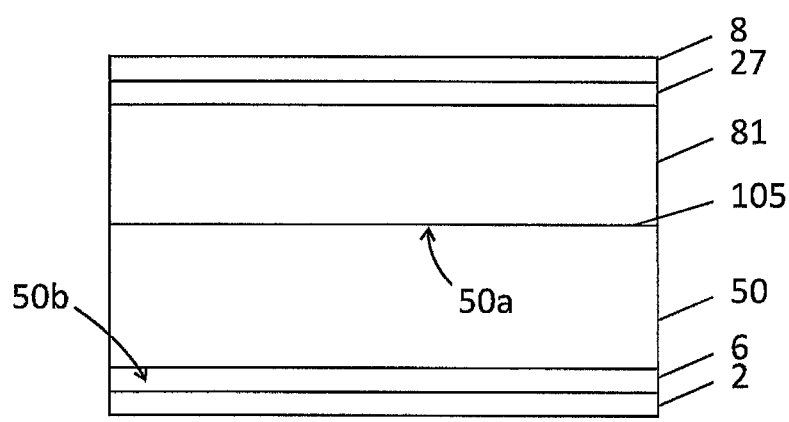
FIG. 4 is a schematic sectional view illustrating a semiconductor laser diode comprising a semiconductor device, manufactured by means of the method illustrated and described in FIGS. 1a-b, comprising a hetero-junction having direction/indirect band gap.

FIG. 4 is a schematic sectional view showing a laser diode (LD) device formed on a semiconductor device manufactured according to the present invention. As illustrated in FIG. 4, the semiconductor substrate 50 is made of at room temperature degenerately doped p-type Si. The grown semiconductor layer 81 is made of sulfur doped or undoped GaxIn1−xAsyP1−y (0<x<1; 0<y<1) and manufactured by the method according to an embodiment of the present invention. The GaxIn1−xAsyP1−y semiconductor layer 81 has a thickness of <2 μm. The undoped GaxIn1−xAsyP1−y layer 81 is further doped by diffusion or implantation of n type impurity, e.g. S to have degenerated dopant concentration at room temperature. An n-side contact layer 27, preferably made of n-type InP doped with n-type impurity, e.g., S is formed on the semiconductor layer 81. An n-electrode 8 is formed on the entire surface of the n-side contact layer 27. The substrate 50 is thinned down to 100 μm. The rear-side 50b of the substrate 50 is shallow implanted with p-type dopant such as B or Ga to form a heavily doped rear-side contact region 6 upon annealing and dopant activation. A p-side electrode 2 is formed on the rear-side contact region 6. A facet of laser diode is formed by cleaving and light emits from an edge of the device. As illustrated in FIG. 4, an abrupt hetero-junction 105, on the front side 50a, is formed between the substrate 50 and the grown semiconductor layer 81.

Figure 5:
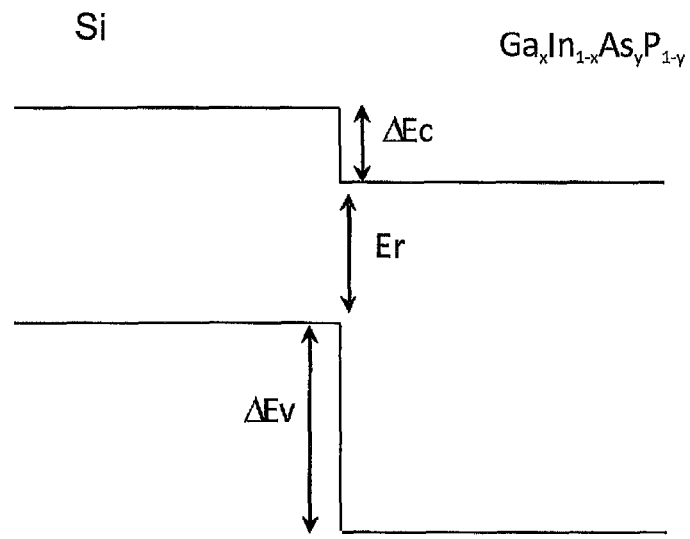
FIG. 5 is band diagram of the semiconductor hetero-junction of FIG. 4 comprising type-II band lineup between $GaxIn1-xAsyP1-y$ and Si.
Figure 6:
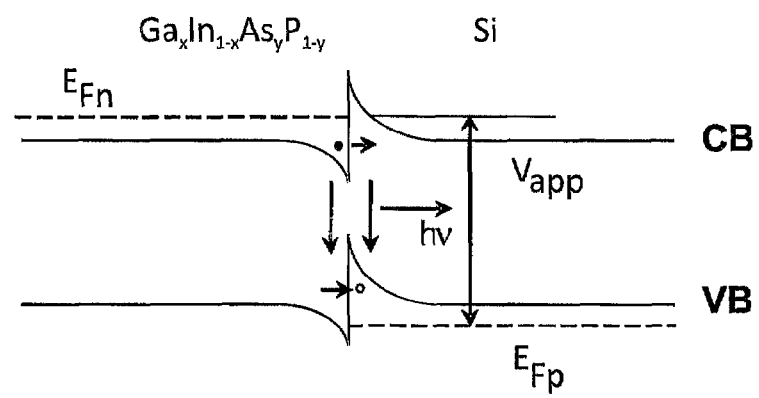
FIG. 6 schematically illustrates a light emission mechanism at a hetero-junction with type-II band lineup and comprising n-type $GaxIn1-xAsyP1-y$ and p-type Si under forward bias.

As shown in FIG. 5, the hetero-junction 105 can have type-II staggered band lineup if the substrate 50 is made of Si and the grown semiconductor layer 81 is made of GaxIn1−xAsyP1−y where an alloy composition ratio x and y are selected to rise the electron affinity of the grown semiconductor layer 81 higher than 4.01 eV, which is the electron affinity of Si. This combination of materials both makes the conduction and the valence band edges of Si shifted upward relative to GaxIn1−xAsyP1−y, and the residual gap at an interface of the hetero-junction 105 is labeled "Er". As illustrated in FIG. 6, both n-type GaxIn1−xAsyP1−y semiconductor layer 81 and p-type Si substrate 50 are doped degenerately. Under forward bias $V_{app}$, the band bends at the interface of hetero-junction 105. Two types of carrier confinement wells develop on the two sides of the interface. Associated with a well formation, free electrons and holes accumulate in the wells. The interface of the GaxIn1−xAsyP1−y/Si hetero-junction obtained by the present invention is sufficiently abrupt. Because of tunneling effect across the interface, the wave functions of the electrons and holes will overlap strongly. The high concentration of accumulated electron-hole pairs in the spatially separated wells can have efficient radiative recombination, although Si is an indirect-band gap semiconductor.

Figure 7:
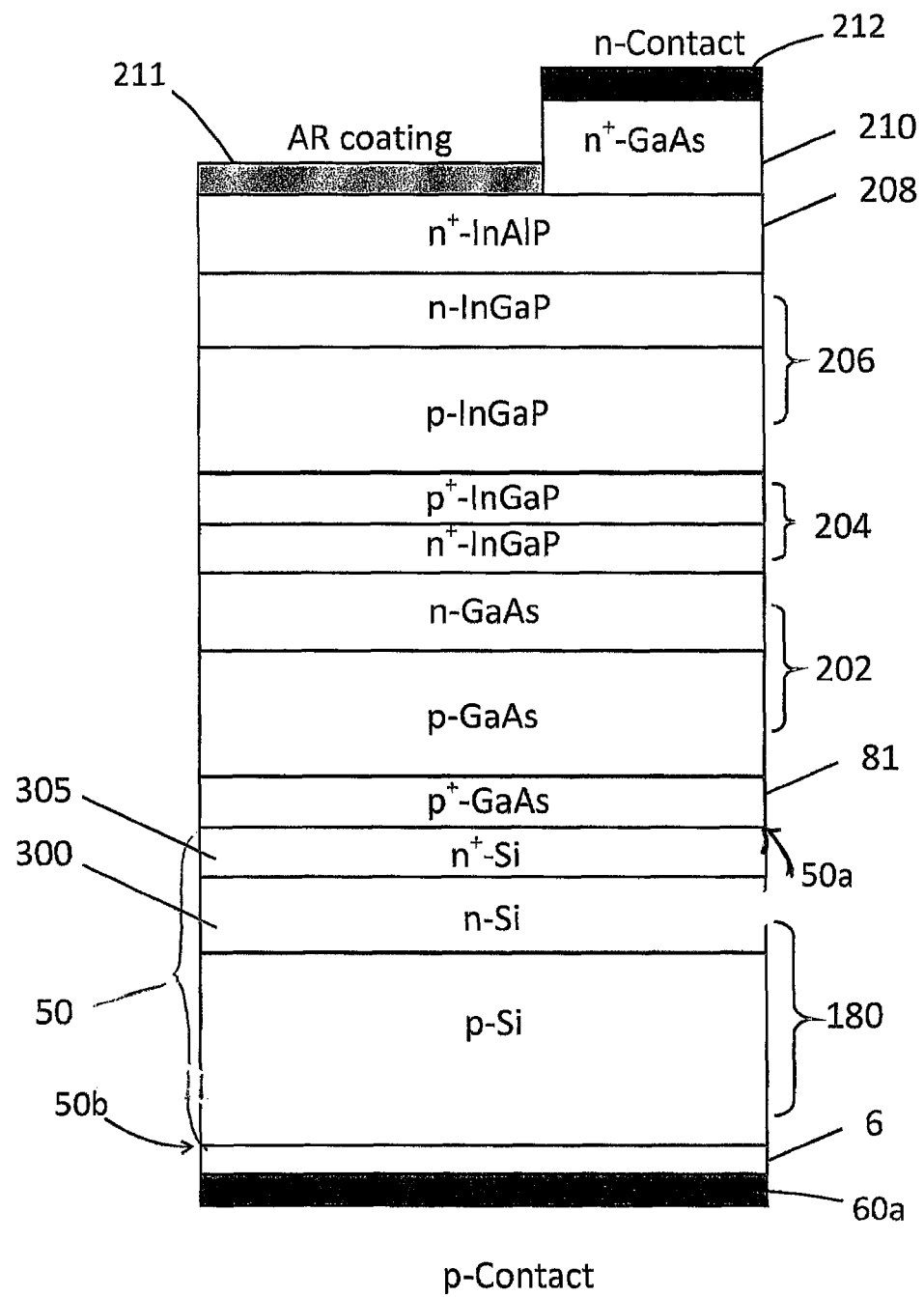
FIG. 7 is a sectional view schematically illustrating a multi-junction solar cell comprising GaInP, GaAs and Si sub-cells supported on a GaAs/Si device manufactured with the method according to an embodiment of the present invention.
Figure 8A:
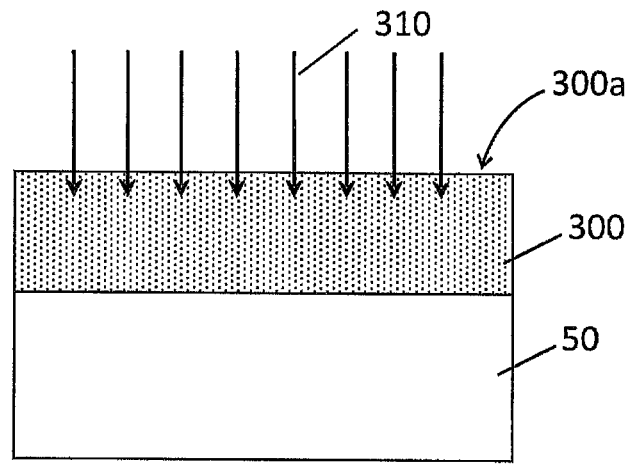
FIGS. 8a to 8b are schematic sectional view for explaining the process to form a Si solar sub-cell in the order of steps.
Figure 8B:
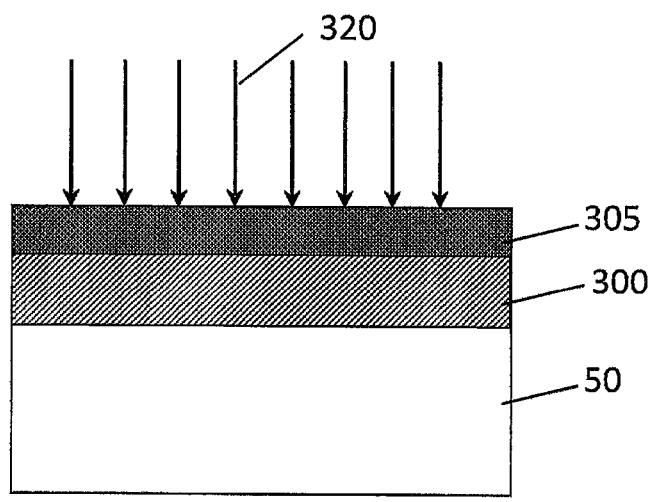

FIG. 7 schematically illustrates a cross-section of a multi-junction solar cell device including a Si sub-cell 180, a GaAs sub-cell 202, and an InGaP sub-cell 206 formed on the semiconductor substrate according to an embodiment of the present invention. Prior to the growth of the buffer layer 52 and seed layer 54 in MOVPE as illustrated in FIG. 2b, the Si substrate 50 is processed to a Si sub-cell as illustrated in FIGS. 8a and 8b. As illustrated in FIG. 8a, a front surface 300a is implanted by a beam 310 with an n-type dopant such as P or As. An n-type emitter region 300 is formed by annealing and dopant activation at elevated temperature. Other alternatives may include diffusion instead of implantation and annealing. The depth of the emitter region 300 is thin and no more than 1 μm. The front surface 300a of the Si substrate is further doped with a higher dose n-type dopant beam 320 by implantation with annealing and dopant activation or diffusion to form a heavily doped surface region 305 to facilitate electrical contact, as illustrated in FIG. 8b. The thickness of the heavily doped surface region 305 is thin and no more than 100 nm. Thus, a silicon p-n solar sub-cell 180 is formed. A p+-GaAs semiconductor layer 81 is grown, by the method of the present invention described with reference to FIGS. 1a, b and 2a-g, on top of the substrate 50 made of p-type Si with p-n solar sub-cell 180. After the growth of the p+-GaAs semiconductor layer 81 by the method according to an embodiment of the present invention, a GaAs sub-cell 202 and an InGaP sub-cell 206 can be manufactured on the p+-GaAs semiconductor layer 81 just as is done in a conventional triple junction solar cell. The GaAs sub-cell and InGaP sub-cell are connected by a tunnel junction 204 made of heavily doped n+ and p+InGaP. On top of the InGaP sub-cell a window layer 208 made of n+-InAlP and a contact layer 210 made of n+-GaAs are grown. The n+-GaAs contact layer 210 is processed to have openings (grey area), where an AR coating 211 is deposited. On top of the n+-GaAs contact layer 210 an n contact 212 is formed. After thinning the Si substrate 50 down to 100 μm, the rear-side 50b of the p-type Si substrate 50 is shallow implanted with p-type dopant such as B or Ga to form a heavily doped rear side contact region 6 upon annealing and dopant activation. A p-side electrode 6a is formed on the rear-side contact region 6.

Figure 11:
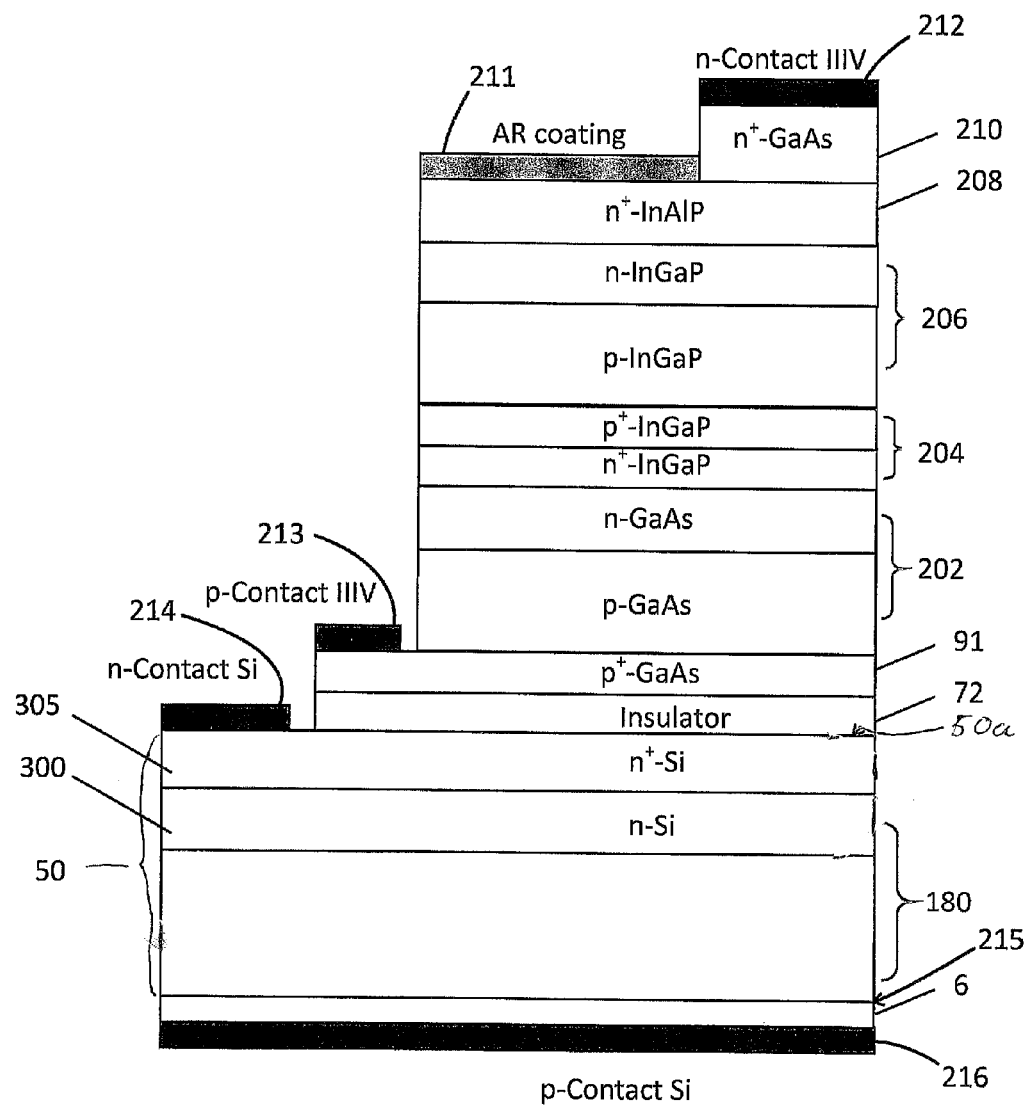
FIG. 11 is a sectional view schematically illustrating a multi-junction solar cell comprising GaInP, GaAs and Si sub-cells supported on a GaAs/Si substrate manufactured with the method according to another embodiment of the present invention.

FIG. 11 schematically shows a cross-section of a multi-junction solar cell device according to an embodiment of the present invention, including an Si sub-cell 180, a GaAs sub-cell 202, and an InGaP sub-cell 206 formed on the semiconductor device 50, herein a substrate of the second embodiment of the present invention illustrated and described with reference to FIGS. 3a-3f. Prior to the growth of the buffer layer 52 and seed layer 54 in MOVPE as illustrated in FIG. 2b, the Si substrate 50 is processed to a Si sub-cell as illustrated in FIGS. 8a and 8b. As illustrated in FIG. 8a, the front surface 300a is implanted by a beam 310 with an n-type dopant such as P or As. An n-type emitter region 300 is formed by annealing and dopant activation at elevated temperature. Other alternatives may include diffusion instead of implantation and annealing. The depth of the n-type emitter region 300 is thin and no more than 1 μm. The front surface 300a of the Si substrate is further doped with a higher dose n-type dopant beam 320 by implantation with annealing and dopant activation or diffusion to form a heavily doped surface region 305 to facilitate electrical contact, as illustrated in FIG. 8b. The thickness of the heavily doped surface region 305 is thin and no more than 100 nm. In this way, a silicon p-n solar sub-cell 180 is formed onto which an insulating layer, or insulator 72 is provided. A p+-GaAs semiconductor layer 91 is grown, by the method of the present invention described with reference to FIGS. 1a-b and 2a-g, on top of the substrate 50 made of p-type Si with p-n solar sub-cell 180. After the growth of the p+-GaAs semiconductor layer 91 by the method according to an embodiment of the present invention, a GaAs sub-cell 202 and an InGaP sub-cell 206 can be fabricated on the p+-GaAs semiconductor layer 91 just as is done in a conventional triple junction solar cell. GaAs sub-cell and an InGaP sub-cell 204 is connected by a tunnel junction made of heavily doped n+ and p+InGaP. On top of the InGaP sub-cell 204 a window layer 208 made of n+-InAlP and contact layer 210 made of n+-GaAs are grown. The n+-GaAs contact layer 210 is processed to have openings 211, where an AR coating is deposited. On top of the n+-GaAs contact layer 210 an n-contact IIIV 212 is formed. A via opening is formed through the stacking of epitaxial layers to the surface of p+-GaAs semiconductor layer 91 and the heavily doped surface region $n^+$-Si 305 is exposed respectively. A p contact IIIV 213 is formed on top of the p+-GaAs semiconductor 91 and an n-contact Si 214 is formed on top of the surface region $n^+$-Si 305. After thinning the Si substrate 50 down to 100 µm, the rear-side 215 of the p-type Si substrate 50 is shallow implanted with p-type dopant such as B or Ga to form a heavily doped rear-side contact region 6 upon annealing and dopant activation. A p-side electrode p contact Si 216 is formed on the rear-side contact region 6. The n/p contact Si 214, 216 and n/p contact IIIV 212, 213 are connected to load separately. Current matching between silicon bottom cell and sub-cells of the so-called "compound semiconductor" is not necessary. High short circuit current of silicon sub-cell will contribute to the total conversion efficiency more efficiently.

While the foregoing written description of the invention enables one of ordinary skill to make and use what is considered presently to be the best mode thereof, those of ordinary skill will understand and appreciate the existence of variations, combinations, and equivalents of the specific embodiment, method, and examples herein. The invention should therefore not be limited by the above described embodiment, method, and examples, but only to the scope of the claims.

The method can be used for manufacturing compound semiconductor light emitting and photovoltaic devices on silicon substrate.

The invention claimed is:

1. A method for manufacturing a semiconductor device having a hetero-structure, the method comprising the steps of:
   forming a buffer layer and a seed layer on a front side of a dissimilar semiconductor substrate,
   processing to provide at least one seed island mesa of the buffer layer and the seed layer,
   forming an insulating mask layer on the at least one seed island mesa, the insulating mask layer having an opening provided on top of the seed island mesa, characterized in
   growing a semiconductor growth layer having consecutive semiconductor regions grown onto each other from the opening, epitaxially, vertically and laterally, wherein a first region having high defect density is only grown vertically from the opening, while the other regions are grown until at least one semiconductor region having low defect density coalesces with the front side of the semiconductor substrate or the insulating mask layer.

2. The method according to claim 1, comprising processing to provide the seed island mesa having a particular orientation (α) on the substrate.

3. The method according to claim 1, wherein the insulating mask layer is formed to cover a top surface and sidewalls of the seed island mesa.

4. The method according to claim 1, where the semiconductor growth layer is grown in gaseous phase.

5. The method according to claim 2, wherein the orientation (α) is selected based on a crystalline plane of the substrate and growth parameters, for instance within a range of 0 to ±45° from <110>direction on the surface of the substrate.

6. The method according to claim 1, wherein the first region and a second region of the semiconductor growth layer with high defect density are removed by etching and a third region with low defect density is left behind from etching to prepare a semiconductor layer for semiconductor device fabrication.

7. The method according to claim 6, wherein the substrate has corrugations and the semiconductor layer fills up the corrugations.

8. The method according to claim 1, the method comprising the step of forming the insulating mask layer on the front side of the semiconductor substrate.

9. The method according to claim 8, wherein the first region and second region with high defect density are removed by etching and the third region with low defect density is left behind from etching to prepare a semiconductor layer on the insulating mask layer for semiconductor device fabrication.

* * * * *